United States Patent [19]
Foell

[11] Patent Number: 5,091,702
[45] Date of Patent: Feb. 25, 1992

[54] AUTOMATIC SWEEP-TO-LOCK CIRCUIT FOR A PHASE-LOCKED LOOP

[75] Inventor: John D. Foell, Auburn, Ind.

[73] Assignee: Magnavox Government and Industrial Electronics Company, Fort Wayne, Ind.

[21] Appl. No.: 631,522

[22] Filed: Dec. 21, 1990

[51] Int. Cl.⁵ .................. H03L 7/12; H03L 7/095
[52] U.S. Cl. ........................... 331/4; 331/8; 331/17; 331/DIG. 2
[58] Field of Search ............... 331/1 A, 4, 8, 15, 16, 331/17, 18, 25, DIG. 2

[56] References Cited
U.S. PATENT DOCUMENTS
4,240,076 12/1980 Williamson ................ 331/4 X OTHER PUBLICATIONS
Gardner, F. M.; *Phaselock Techniques;* 1979 John Wiley & Sons, Inc.; pp. 82–83.

*Primary Examiner*—David Mis
*Attorney, Agent, or Firm*—Roger M. Rickert; Richard T. Seeger

[57] ABSTRACT

A method for a phase-locked loop, which circuit includes, in a preferred embodiment, a resistor to unbalance phase detector outputs to an operational amplifier to cause the voltage output of the operational amplifier to sweep and thus cause the frequency output of a voltage controlled oscillator to sweep. Simple circuitry detects correct lock and terminates sweeping; or, if lock is not achieved, causes the output of the operational amplifier to remain at a low level until the operational amplifier is reset and then permits resweep. Very little auxiliary circuitry is required.

9 Claims, 4 Drawing Sheets

FIG_1
(PRIOR ART)

FIG_2
(PRIOR ART)

AUTOMATIC SWEEP-TO-LOCK CIRCUIT FOR A PHASE-LOCKED LOOP

BACKGROUND OF THE INVENTION

1. Field of the Invention

The present invention relates generally to phase-locked loops and, more particularly, to a novel sweep-to-lock circuit for a phase-locked loop of the type having an analog phase detector, which circuit causes rapid locking and provides automatic initiation of sweeping and resweeping, prevention of false locks, detection of correct lock, and halting of sweep at correct lock.

2. Background Art

Phase-locked loops are widely employed in electronic circuitry and are used, for example, in satellite communication systems, airborne navigation systems, and FM communication systems, providing the functions of, for example, phase detection, frequency modulation/demodulation, frequency division/multiplication (frequency synthesis), filtering, and voltage-controlled oscillator stabilization. The basic technique compares the frequency and phase of the incoming signal to the output of a voltage controlled oscillator (VCO). If the two signals differ in frequency and/or phase, an error voltage is generated and applied to the VCO, causing it to correct in the direction required for decreasing the difference. The correction procedure continues until lock is achieved, after which the VCO will continue to track the incoming signal as long as it remains within the bandwidth and operational frequency range of the loop.

Typically, such a circuit may employ a digital phase/frequency detector which ensures that loop lock is achieved no matter how far off frequency the system initially is. A disadvantage with such a detector, however, is that, although it is power efficient at low frequencies of hundreds of KHz or less, it consumes excessive power at higher frequencies of 10's of MHz or more and is unsuitable for applications such as in the transmit circuits of portable radios, for example. In such applications, the use of a frequency divider placed in front of the phase/frequency detector reduces the power problems somewhat, but the frequency divider generates a series of frequencies at multiples of the phase comparison frequency. The transmit frequency can leak into the frequency divider to produce frequencies which mix with multiples of the phase comparison frequency. The resulting frequency is often within the bandwidth of the loop, thus resulting in unwanted frequency modulation or the generation of spurious outputs.

To avoid the use of frequency dividers and digital phase/frequency detectors, analog phase detectors (typically mixers) are employed in higher frequency applications. Since this type of phase detector cannot automatically force the loop to lock, an auxiliary sweeping circuit is used to drive the transmit VCO to the proper transmit frequency.

The use of the analog mixer type of phase detector reduces the potential for generation of spurious frequencies greatly, but it adds some potential problems of its own. This is mainly due to the need to sweep the loop to lock. Minor potential problems are concerned with the possible added complexity of the sweep circuit. The major potential problems concern the phenomenon known as "false lock" and deciding when to sweep and when to terminate sweep. False lock refers to the situation in which the phase detector "sees" zero phase error, but the VCO is at the incorrect frequency. This can happen in two ways.

One type of false lock that is fairly easily prevented is that which occurs when the sweep circuit sweeps the VCO to a frequency which has a definite mathematical relationship to the correct frequency. In a simple tracking loop (illustrated later), this would be a harmonic of the correct frequency. A tracking loop is a loop which, when locked, provides an output frequency which equals the input frequency. In a translation loop (illustrated later), this false frequency would be the image of the correct frequency. A translation loop is a loop which, when locked, provides an output frequency which is offset from the input frequency by a constant difference over a range of operating frequencies. The image frequency is equal to the correct frequency plus or minus twice the frequency of phase comparison (the constant offset frequency referred to above), depending on whether the input frequency is above or below the output frequency when the loop is correctly locked. This type of false lock problem is solved by always sweeping in the proper direction. In the case of harmonic false locking (tracking loop) or where the image frequency (translation loop) is above the desired frequency, sweep always starts with the VCO at much less than the correct frequency, and the frequency increases with the sweep. This ensures that the VCO never sweeps through the false frequency, since it sweeps to the correct frequency first. The loop then locks and the sweep is stopped before the VCO reaches the false frequency. In the case of translation loops, if the image frequency is below the desired frequency, the VCO is swept in the other direction.

The other type of false lock is much more subtle and much more damaging than the harmonic or image false lock discussed above, as it is harder to detect. This type of false lock occurs when there is an interaction between the phase detector (which commonly has a sinusoidal or triangular phase characteristic in which the output polarity or slope alternates positive and negative for each 180 degrees of phase difference at the inputs), the VCO, and the entire loop filter's phase shift versus frequency characteristic. The "entire loop filter" includes the "classical" or "intended design" loop filter or integrator and any phase shift resulting from intermediate frequency amplifiers and filters, if present, and all extra, possibly unwanted but unavoidable poles which cause additional phase shift. As the VCO is sweeping and approaching the desired frequency, the phase detector begins to generate a beat frequency equal to the difference of the two frequencies at its inputs. This beat frequency appears as a ripple voltage at the phase detector output and frequency modulates the VCO. As the beat frequency approaches zero Hertz, or correct lock, the levels of the FM sidebands and their frequencies, which are offset from the VCO carrier frequency by multiples of the beat frequency, and the total phase shift around the loop create a situation where one of the FM sidebands is at the desired (correct) VCO frequency and is of sufficient amplitude that the loop locks on it.

In the above case, the loop is in a stable oscillatory mode where the phase detector "thinks" it is properly locked (i.e., sweeping stops), but it is only locked on a sideband caused by the beat frequency. If the loop's output signal (or the constant offset frequency in the case of translation loops) is frequency or phase modulated, it may also participate in the problem to some extent. This is not usually of serious concern if the loop is properly designed to prevent false locks when no modulation is present. This problem is exacerbated if the loop is made to have a very high gain (which is good for other reasons, such as a low steady-state phase error when the loop is locked), as the false lock only has to generate a very small DC component at the phase detector to hold the loop at the incorrect condition.

A further disadvantage of previously known phase-locked loops with analog detectors is that functions such as initiating sweeping, false lock avoidance, lock detection and sweeping termination, and re-sweep (if needed) are provided by auxiliary circuitry such as lock detectors, sweep generators, discriminators, and microprocessors. This adds complexity and cost to the system. In fact, the additional circuitry may be more complex and may consume more space, power, etc., than the basic loop itself.

Accordingly, it is a principal object of the present invention to provide a sweep-to-lock circuit for a phase-locked loop, which circuit is completely automatic and requires little auxiliary circuitry and no microprocessor inputs.

It is an additional object of the invention to provide such a circuit which rapidly achieves lock.

It is a further object of the invention to provide such as circuit which automatically provides for initiating sweeping, false lock avoidance, lock detection and sweeping termination, and re-sweep in the case that lock is lost for any reason.

It is another object of the invention to provide such a circuit which is simple, economical, and consumes little power.

Other objects of the present invention, as well as particular features, elements, and advantages thereof, will be elucidated in, or be apparent from, the following description and the accompanying drawing figures.

SUMMARY OF THE INVENTION

The present invention achieves the above objects, among others, by providing a sweep-to-lock circuit for a phase-locked loop, which circuit includes, in a preferred embodiment, a resistor to unbalance phase detector outputs to an operational amplifier to cause the voltage output of the operational amplifier to sweep and thus cause the frequency output of a voltage controlled oscillator to sweep. Simple circuitry detects correct lock and terminates sweeping; or, if lock is not achieved, causes the output of the operational amplifier to remain at a low level until the operational amplifier is reset and then permits resweep. Very little auxiliary circuitry is required.

BRIEF DESCRIPTION OF THE DRAWING

Understanding of the present invention and the various aspects thereof will be facilitated by reference to the accompanying drawing figures, submitted for purposes of illustration only and not intended to define the scope of the invention, in which.

DETAILED DESCRIPTION OF THE PREFERRED EMBODIMENTS

Figure 1:
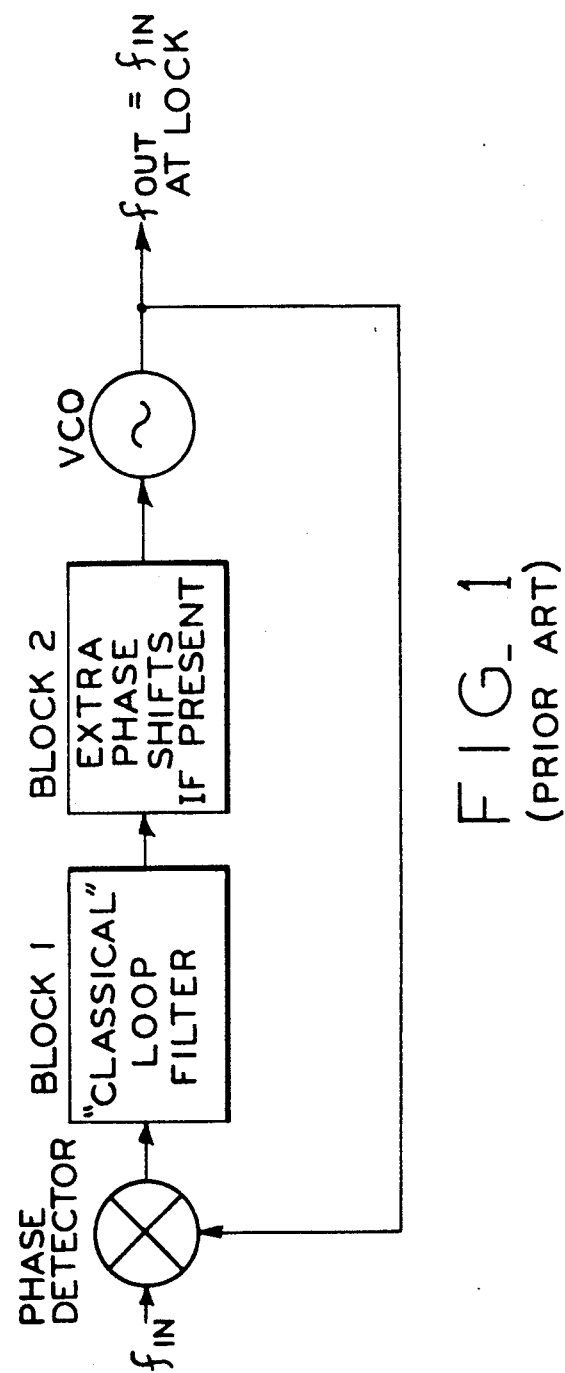
FIG. 1 is a block diagram of a typical conventional tracking loop to which the present invention may be applied.
Figure 2:
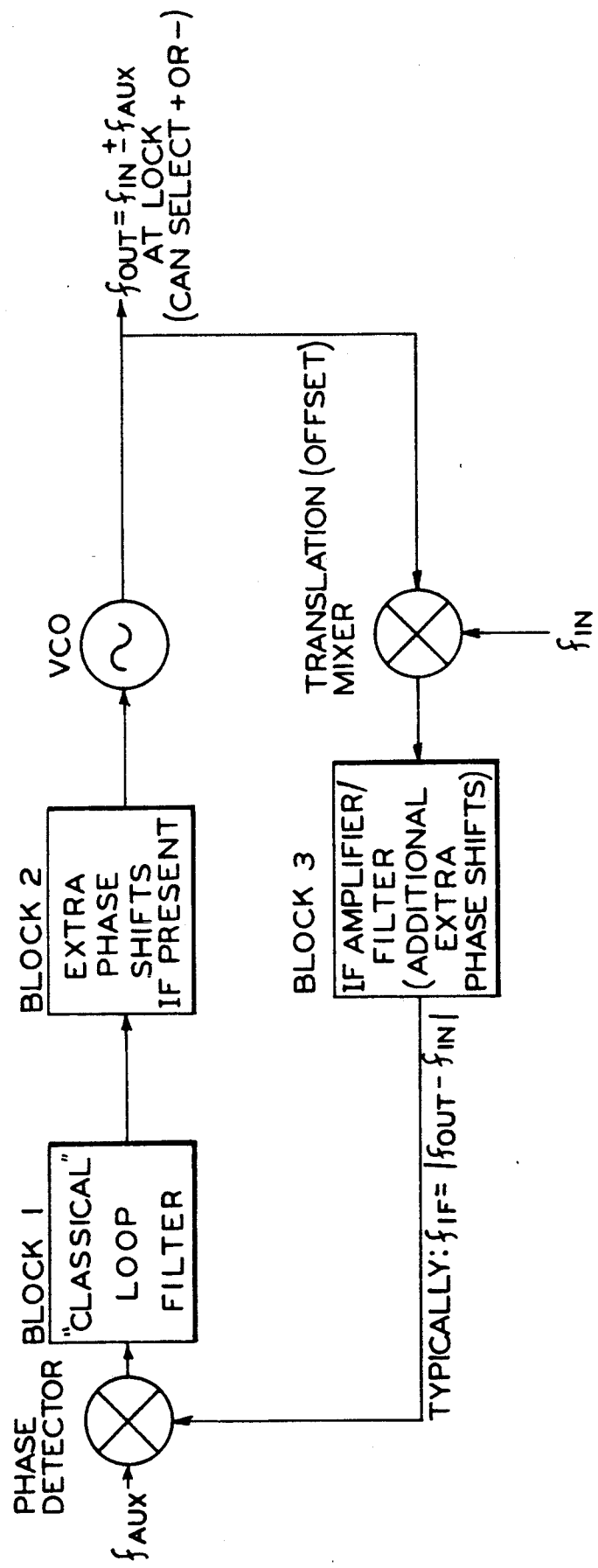
FIG. 2 is a block diagram of a typical conventional translation loop to which the present invention may be applied.

Referring now to the Drawing, FIGS. 1 and 2 illustrate typical phase-locked loop configurations to which the present invention may be applied. It will be understood that the configurations shown on FIGS. 1 and 2 are illustrative only and are merely two of many to which the present invention is applicable. FIG. 1 is a tracking loop in which the output frequency is equal to the input frequency over the design range of input frequencies when the loop is locked. FIG. 2 is a translation loop in which the output frequency is equal to the input frequency offset by the auxiliary input frequency over the design range of input and auxiliary frequencies. Those skilled in the art will readily recognize these configurations.

On both FIGS. 1 and 2, Block 1 represents the "classical" or "intended design" loop filter or integrator which usually contains some type of high gain DC amplifier such as an operational amplifier. Almost all practical phase-locked loops contain circuitry analogous to Block 1. This filter is typically intended to control the dynamic properties of the loop including, but not limited to, stability, loop bandwidth transient response, and operating ("bias") points of the loop components such as the phase detector. Blocks 2 and 3, if present, represent the additional phase shift added to the open loop transfer function ("open loop gain") by other elements in the loop. These "other elements" may include radio frequency bypass components, the voltage control circuitry in the VCO, the load on the VCO (may cause "load pull" of frequency and/or phase), any additional noise or spurious signal filters, and the intermediate frequency amplifier/filter of translation loops. In all practical loop designs, it is almost impossible to avoid some extra, undesired phase shift due to these components. These effects may be modeled in the steady state (assuming loop is locked), but may interfere greatly with the locking process in the dynamic state and cause false locks.

Figure 3:
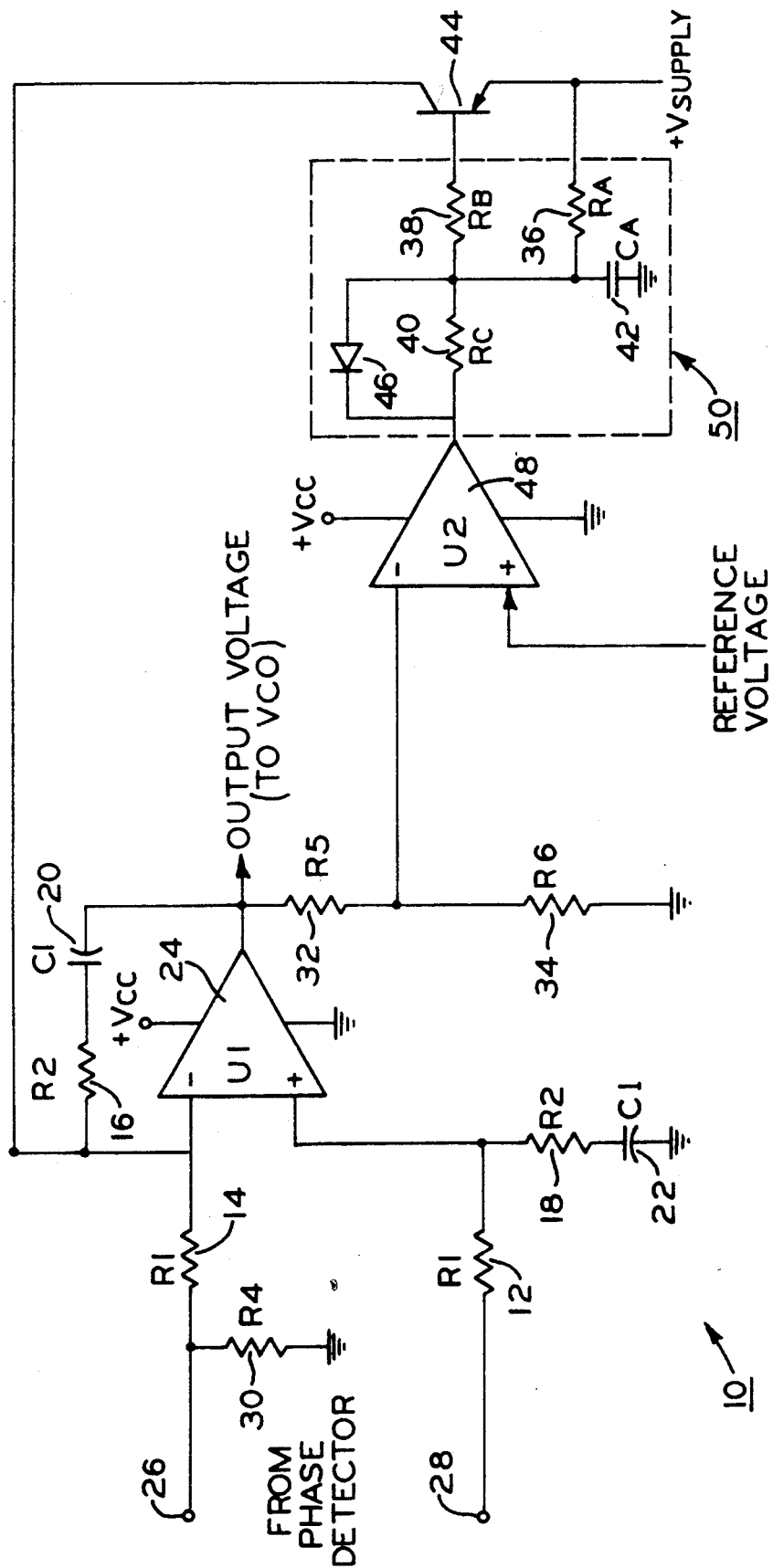
FIG. 3 is a schematic diagram of a sweep-to-lock circuit for a phase-locked loop according to the present invention.

FIG. 3 illustrates a sweep-to-lock circuit for a phase-locked loop filter, generally indicated by the reference numeral 10, which achieves the objects of the present invention and which is intended to be employed as Block 1 in the phase-locked loops illustrated on FIGS. 1 and 2. Circuit 10 is intended for use with a double ended (differential) output phase detector; although, it may be used with a single ended output phase detector with minor modifications. Those skilled in the art will recognize that, resistors 12, 14, 16, and 18, capacitors 20 and 22, and operational amplifier 24 comprise a conventional loop filter which is modified by the additional components to achieve the objects of the present invention. Usually resistors 12 and 14 are equal to each other as are resistors 16 and 18. Likewise, capacitors 20 and 22 are usually equal to each other. Circuit 10 results in a classic high gain loop and is an integrator having a high frequency zero to prevent excessive phase shift at higher frequencies which can (and usually does) cause the loop to oscillate.

The components controlling the "sweep-to-lock" function are the conventional loop filter described above (it does double duty, as resistors 12 and 14 and capacitors 20 and 22 partially determine the rate of sweep) and resistors 30, 32, 34, 36, 38, and 40, a capacitor 42, a transistor 44, a diode 46, and a comparator 48. Resistor 30 is connected to the inverting input of operational amplifier 24. Resistors 32 and 34 are connected in series between the output of operational amplifier 24 and ground, with the inverting input of comparator 48 being connected between the resistors. One end of resistor 40 is connected to the output of comparator 48 and the other end of that resistor is connected to one end of resistor 38, the other end of the later being connected to the base of transistor 44. The collector of transistor 44 is connected to the inverting input of operational amplifier 24. Capacitor 42 is connected between ground and the junction of resistors 38 and 40. Resistor 36 is connected between that junction and the emitter of transistor 44 and diode 46 is connected to conduct current from that junction to the output of comparator 48. Together, components 36, 38, 40, 42, and 46 comprise a "ratcheting" circuit, generally indicated by the reference numeral 50, the function of which is described below. A reference voltage is supplied to comparator 48 to determined the trip point thereof. This voltage may be developed in one of several conventional ways depending on the actual application.

The function of each sub-circuit and component of the invention will now be described with reference to FIG. 3. Resistor 30 is used to unbalance the inputs to the loop filter to cause a positive going sweep at the output of operational amplifier 24. The configuration shown assumes that the phase detector is a differential output device having some finite impedance and zero DC differential voltage at "zero phase error". The invention is not limited by this assumption, however, as any method which allows for the unbalancing of the inputs to the loop filter while allowing the phase detector to re-balance those inputs upon lock may be used. Such methods include, but are not limited to, the use of voltage dividers, offsetting diode drops, and/or auxiliary voltages applied to one or both of the loop filter inputs. Most practical differential output devices have some "built-in" unbalance, but that is usually unreliable as to polarity and magnitude and cannot be relied upon to produce the desired amount of imbalance. The central idea is to provide known unequal DC voltages at both inputs (i.e., an offset) when the loop is unlocked, but to allow the phase detector to cancel this unbalance (by developing a cancelling voltage) when proper lock is achieved. The rate of sweep is equal to the offset voltage at the two loop filter inputs divided by the product of the value of resistor 14 and the value of capacitor 20.

Transistor 44 is used to reset the sweep. If it is on, the non-inverting input of the loop integrator is pulled high. This causes the output of the integrator to rapidly slew toward ground (the reset condition in this case). The loop integrator input unbalancing circuit (resistor 30 in the case of FIG. 3) is permanently in the circuit while transistor 44 is switched on and off as required. When transistor 44 is off, the sweep direction is positive, but, when the transistor is on, the sweep direction is negative going and much faster, due to the connection of the inverting input of operational amplifier 24 to a relatively large positive voltage. This rapid negative going sweep is used to reset the sweep-to-lock circuit. Other devices may be used to perform the function of transistor 44 including, but not limited to, field effect transistors, semiconductor controlled rectifiers, and relays. The object is to be able to rapidly reset the sweep.

Comparator 48 compares the output voltage to a reference voltage. Resistors 32 and 34 may be used to reduce the output voltage so that, at correct lock, the relationship of the output voltage to the reference voltage may be set as required. On FIG. 3, it is desired to arrange the circuit so that, at correct lock, the output voltage is less than the reference voltage. This also may be arranged to invert this relationship by placing a voltage divider in the reference voltage line instead of the output voltage line. Various other circuits (active or passive) may be placed in either or both lines (to the inverting and noninverting inputs of comparator 48) to maintain any desired relationship of the reference and output voltages at correct lock. When the voltage at the inverting input of comparator 48 is less than the voltage at the noninverting input, the comparator output will be high (near +VCC) and transistor 44 will be held off. When the reverse situation is present at the inputs, the output of comparator 48 will be low (near ground) and the transistor will be turned on, thus resetting the sweep.

Examples of the treatment of the reference voltage include, but are not limited to, the following: For a tracking loop, the reference voltage may be set to force the loop to resweep before the loop can lock to the harmonic of the correct lock frequency. For a translation loop, the reference voltage may be connected to the tuning voltage of the VCO which generates the input voltage (usually part of another phase-locked loop) so as to prevent the translation loop from locking on the image of the correct output frequency. What is needed here is a decision as to when to initiate resweep so as to prevent one of the types of false locks (the less subtle one) discussed above.

The components placed between transistor 44 and comparator 48, specifically diode 46, resistors 36, 38, and 40, and capacitor 42, form "ratcheting" circuit, or "pulse stretcher" 50. Circuit 50 is needed to prevent the sweep circuit from oscillating as follows: When the output of comparator 48 is low, transistor 44 is on and the loop rapidly resets. Diode 46 discharges capacitor 42 rapidly through its low "on" resistance, and resistors 36, 38, and 40 are chosen so as to maintain this condition. As soon as the sweep voltage (output voltage to VCO) falls below the trip point of comparator 48, the comparator's output goes high. Diode 46 is now reverse biased, thus capacitor 42 must charge through resistors 36, 38, and 40. By proper choice of the values of the foregoing resistive and capacitive components, transistor 44 may be kept on until the output voltage sweeps to essentially zero volts. If the ratcheting circuit were not present (if the output of comparator 48 were connected to the transistor base through a simple resistive network with no capacitor and diode), as soon as the sweep voltage fell below the trip point of the comparator, transistor 44 would be turned off and normal (positive) sweep would occur up to the point at which resweep would be initiated. Since the sweep would never be fully reset, the sweep circuit would oscillate around a point near the trip point of comparator 48 and the loop would not be brought to the correct lock, but, rather, would be "hung up" at an unlocked condition. Adding only capacitor 42 would merely slow the frequency of the oscillation, so diode 46 must also be added to ensure proper reset of the sweep. Diode 46 along with resistor 40 act as a "leaky flap valve" by allowing capacitor 42 to be rapidly discharged when comparator 48 goes low, but slowly charged when comparator 48 goes high. This provides a "racheting" action to ensure that transistor 44 remains on long enough to fully reset the sweep. It should be noted that, in a practical circuit, resistors 36, 38, and 40 usually perform a secondary function of preventing transistor breakdown (when transistor 44 is off) and limiting base current drive (when transistor 44 is on). A specific application of this circuit may only need one or two resistors depending on the actual components, supply voltages, etc. employed. The action of ratcheting circuit 50 is mainly to ensure that sweep is fully reset. Other, more complicated circuits (such as one-shot multivibrators) may be used to perform this function, but, in any case, the sweep should be fully reset (or at least brought below the point of correct lock so it can sweep up to correct lock) on each sweep cycle.

The action of preventing the more subtle type of false lock and automatically halting sweep at correct lock will now be described. The offset due to resistor 30 (or through other means as indicated above) is set so that, at any of the false lock frequencies, there is not enough DC signal generated at the inputs to the loop integrator to overcome the designed in offset, thus the circuit continues sweeping; but, at the correct lock condition, the DC signal generated by the phase detector is more than enough to overcome the offset and the loop automatically locks. What actually happens is that the sweep brings the loop to a condition where the loop is within the lock-in range of the loop and loop locks up. The lock-in range of a phase-locked loop is that range of frequencies, above and below the correct lock frequency, where the absolute value of the frequency difference (actual minus correct) is less than the loop's bandwidth. In this case, the loop will lock up almost instantaneously without skipping cycles (no beat frequency present at the output of the phase detector).

The action of the offset voltage causes the loop to operate, when locked, with a steady state phase error sufficient to overcome the offset. In practice, the offset required to prevent false lock results in a small (usually less than 20 degrees) steady state phase error. If any frequency modulation is present (for example, in a translation loop which adds the modulation to the output frequency by using a modulated auxiliary frequency), this causes slight perturbations around the steady state point, especially in high gain loops. It should be noted that a mixer type phase detector requires the "zero phase error" condition to exist when the inputs to the phase detector are actually in quadrature (90 degrees out of phase). All references to phase error when discussing this type of detector are with respect to this perfect quadrature condition. With other types of phase detectors, the "zero phase error" condition may or may not be when the inputs to the phase detector are in phase coincidence; however, this is not central to the invention.

The "auto-sweep to-lock" action of the circuit of FIG. 3 is as follows: Assume that the output voltage to VCO is at a point which is below correct lock. Offset caused by the offset circuit (resistor 30) causes the loop integrator to sweep the output voltage to the correct lock (avoiding false locks) as described above. If the output voltage is initially above correct lock, the voltage continues to sweep until comparator 48 senses the oversweep condition and pulses transistor 44, thus resetting and reinitiating the sweep. In all cases, the offset causes sweep until the correct lock is obtained and the offset is overcome. The sweep then stops and the loop is locked. The entire process is completely automatic. One design which has been reduced to practice takes less than 20 milliseconds to achieve correct lock from any starting condition.

In actuality, it is extremely difficult to lose lock once it has been achieved, especially for a properly designed high gain loop. Ordinarily, lock occurs on the first sweep. However, in the event that lock does not occur on the first sweep (for example the initial condition at circuit power on may be above correct lock) or some external disturbance occurs which throws the loop out of lock once it has achieved lock, the resweep feature makes the system foolproof.

Figure 4:
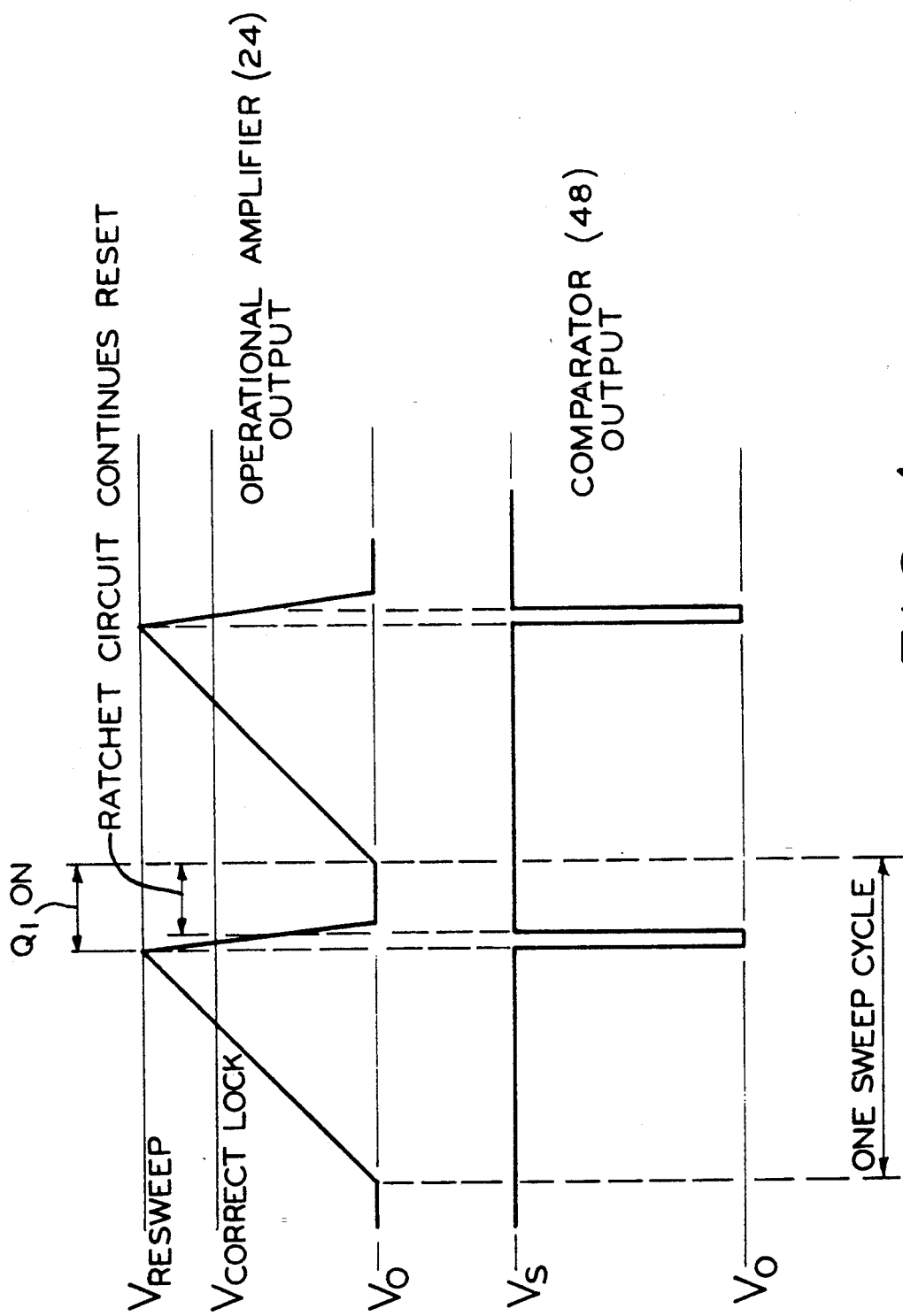
FIG. 4 illustrates waveforms produced by components of the circuit of FIG. 3 during sweep and re-sweep.

FIG. 4 illustrates the output waveforms of loop integrator 24 and comparator 48 during sweeping and reset as described above. The action of ratcheting circuit 50 is also further illustrated here where it can be seen that the ratcheting circuit holds transistor 44 on for a period of time after the output of comparator 48 drops to zero, so that the output of operational amplifier 24 can drop to zero before resweeping is initiated. Typical figures for an actual circuit are a sweep cycle of 20 milliseconds total with a reset time of 5 milliseconds (transistor 44 is on during reset).

Although the present invention has been described as employing a positive going sweep, it may be adapted to employ a negative going sweep and can be adapted to either positive or negative power supplies by those skilled in the art and the appended claims are intended to cover such.

While the present invention has been described as being applied to a phase-locked loop employing an analog phase detector, it will be understood by those skilled in the art that it may be applied as well to a phase-locked loop employing a digital detector and such is within the intent of the present invention.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

I claim:

1. A sweep-to-lock circuit for a phase-locked loop having a voltage controlled oscillator and a phase detector, the sweep-to-lock circuit comprising:
    (a) first circuit means connected to receive an input voltage from the phase detector and to provide a sweeping output voltage to the voltage controlled oscillator;
    (b) second circuit means to cause a given condition of said input voltage;
    (c) third circuit means to determine when a desired value of said output voltage has been exceeded and to cause said output voltage to drop to a reset level in response thereto; and (d) fourth circuit means to prevent, for a selected interval of time, said first circuit means from providing a subsequent sweep, thereby to assure that said reset value is reached before said subsequent sweep is begun (e) the value of said output voltage sweeping in a selected direction from the reset value to a maximum value in response to the given condition of said input voltage, thereby causing the frequency output of said voltage controlled oscillator to sweep.

2. A sweep-to-lock circuit, as defined in claim 1, wherein said first circuit means comprises an operational amplifier.

3. A sweep-to-lock circuit, as defined in claim 2, wherein said second circuit means includes means to unbalance the inputs to said operational amplifier to initiate said output voltage sweeping.

4. A sweep-to-lock circuit, as defined in claim 1, wherein said third circuit means comprises a comparator having inputs connected to the output of said first circuit means and to a reference voltage, the output of said comparator providing a signal to said first circuit means to cause said output voltage of said first circuit means to drop to said reset level.

5. A sweep-to-lock circuit, as defined in claim 4, wherein said output of said comparator switches on switch means to provide said signal to said first circuit means.

6. A sweep-to-lock circuit, as defined in claim 5, further comprising said fourth circuit means disposed between said comparator and said switch means to keep said switch means switched on for said selected interval of time.

7. A sweep-to-lock circuit, as defined in claim 3, wherein said second circuit means further causes iterations of said output sweeping to continue until proper lock is attained, while avoiding false locks.

8. A method of sweeping a phase-locked loop to lock, comprising:

(a) receiving an input voltage from a phase detector and providing an output voltage to a voltage controlled oscillator, the value of said output voltage sweeping in a selected direction from a reset value to a maximum value in response to a given condition of said input voltage, thereby causing the frequency output of said voltage controlled oscillator to sweep;

(b) causing said given condition;

(c) determining when a desired value of said output voltage has been exceed and causing said output voltage to drop to said reset level in response thereto; and (d) preventing, for a selected interval of time, a subsequent sweep of said output voltage, thereby to assure that said reset value is reached before said subsequent sweep is begun.

9. A method, as defined in claim 8, further causing iterations of said output sweeping to continue until proper lock is attained, while avoiding false locks.

* * * * *